United States Patent
Wood (10) Patent No.: US 8,355,687 B2
(45) Date of Patent: Jan. 15, 2013

(54) RECEIVER GAIN CONTROL

(75) Inventor: Roger Wood, Cambridge (GB)

(73) Assignee: Cambridge Silicon Radio Limited, Cambridge (GB)

(*) Notice: Subject to any disclaimer, the term of this patent is extended or adjusted under 35 U.S.C. 154(b) by 933 days.

(21) Appl. No.: 12/037,125

(22) Filed: Feb. 26, 2008

(65) Prior Publication Data

US 2008/0293370 A1 Nov. 27, 2008

(30) Foreign Application Priority Data

Feb. 28, 2007 (GB) .................................. 0703883.9

(51) Int. Cl.
*H04B 17/00* (2006.01)
*H04B 1/06* (2006.01)
*H04B 7/00* (2006.01)

(52) U.S. Cl. ............... 455/232.1; 455/226.2; 455/234.1; 455/250.1

(58) Field of Classification Search ............... 455/67.11, 455/67.13, 136, 138, 226.1–226.4, 232.1, 455/234.1–235.1, 239.1–253.2
See application file for complete search history.

(56) References Cited

U.S. PATENT DOCUMENTS

| | | | | |
|---|---|---|---|---|
| 5,204,976 A | * | 4/1993 | Baldwin et al. | 455/234.2 |
| 5,884,152 A | * | 3/1999 | Matsumoto | 455/234.1 |
| 6,212,244 B1 | * | 4/2001 | Davidovici et al. | 375/345 |
| 6,563,891 B1 | * | 5/2003 | Eriksson et al. | 375/345 |
| 6,735,422 B1 | * | 5/2004 | Baldwin et al. | 455/232.1 |
| 7,068,987 B2 | * | 6/2006 | Baldwin et al. | 455/232.1 |
| 7,212,798 B1 | * | 5/2007 | Adams et a | 455/251.1 |
| 7,242,915 B2 | * | 7/2007 | Shi | 455/232.1 |
| 7,295,517 B2 | * | 11/2007 | Anim-Appiah et al. | 370/232 |
| 7,386,285 B2 | * | 6/2008 | Yamauchi | 455/136 |
| 7,471,748 B2 | * | 12/2008 | Habuka et al. | 375/345 |
| 7,522,885 B2 | * | 4/2009 | Parssinen et al. | 455/67.11 |
| 7,809,095 B2 | * | 10/2010 | Sato | 375/347 |
| 2002/0057750 A1 | * | 5/2002 | Nakao et al. | 375/345 |
| 2006/0002495 A1 | * | 1/2006 | Shirakawa et al. | 375/345 |
| 2006/0025090 A1 | * | 2/2006 | Shirakata et al. | 455/136 |
| 2007/0058739 A1 | * | 3/2007 | Aytur et al. | 375/260 |
| 2008/0317176 A1 | * | 12/2008 | Oh | 375/345 |
| 2009/0046607 A1 | * | 2/2009 | Lee et al. | 370/294 |

* cited by examiner

*Primary Examiner* — Simon Nguyen
(74) *Attorney, Agent, or Firm* — Nova Druce DeLuca + Quigg LLP (57) ABSTRACT

A gain controller for controlling the gain of at least one amplifier in a receiver, the gain controller being arranged to, when the receiver is receiving a signal: for a first period of time, repeatedly determine an indication of the strength of the received signal and adjust the gain of the at least one amplifier in dependence on each indication of signal strength and following the expiry of the first period of time: determine a subsequent indication of the strength of the received signal and make a single adjustment of the gain of the at least one amplifier in dependence on the subsequent indication of signal strength.

33 Claims, 5 Drawing Sheets

RECEIVER GAIN CONTROL

BACKGROUND OF THE INVENTION

1. Field of the Invention

The invention relates to a gain controller that is capable of controlling the gain of one or more amplifiers in a receiver.

The receive chain of a conventional receiver includes amplifiers for amplifying the received signal. In this way, the amplitude of the received signal can be altered so that it is sufficiently large for the signal to be successfully decoded but not so large that the signal is subject to clipping.

2. Description of Related Art

Many receivers include variable amplifiers. The gain of these amplifiers can be adjusted to compensate for variations in signal strength. Thus, when the received signal has a relatively large amplitude the gain of the amplifiers can be adjusted to be relatively low and when the received signal has a relatively small amplitude the gain of the amplifiers can be adjusted to be relatively high. The gain of the amplifiers is typically controlled by a gain controller, implemented in hardware or software, which adjusts the gain of the amplifiers in dependence on a measured signal strength of the received signal. Problems can arise if a loud interferer is being received when the strength of the received signal is measured to set the gain of the variable amplifier, as this can result in the gain being set too low. Loud interferers can cause errors of up to 9 or 12 dB. One method of addressing this problem is to operate the gain control as a free running process in which the gain control continuously measures the received signal strength and adjusts the gain of the variable amplifiers when necessary.

A disadvantage with the continuous gain control method described above is that using continuous gain control can tend to lead to "hunting", in which the amplifier gain continuously oscillates about the correct gain. This problem is particularly acute in conventional gain controllers which typically make individual gain adjustment as high as 6 dB. A 6 dB error is sufficient to significantly reduce the quality of the decoding achieved by a receiver such as a modem. One solution to this problem would be to limit the length of time for which the continuous gain control is operational. However, this is problematic if a loud interferer is present during the limited length of time for which the gain is controlled continuously. A loud interferer can cause the gain controller to repeatedly reduce the gain to such an extent that when the interferer has stopped transmitting the gain is too low for the receiver to be able to correctly decode the wanted signal. These errors must be compensated for or higher order modulation schemes will not work.

Therefore, there is a need for an improved gain controller and method of gain control for a receiver.

BRIEF SUMMARY OF THE INVENTION

According to a first embodiment of the invention, there is provided a gain controller for controlling the gain of at least one amplifier in a receiver, the gain controller being arranged to, when the receiver is receiving a signal: for a first period of time, repeatedly determine an indication of the strength of the received signal and adjust the gain of the at least one amplifier in dependence on each indication of signal strength and, following the expiry of the first period of time: determine a subsequent indication of the strength of the received signal and make a single adjustment of the gain of the at least one amplifier in dependence on the subsequent indication of signal strength.

The gain controller may be arranged to, during the first period of time, wait a predetermined length of time after each adjustment of the at least one amplifier before determining a further indication of signal strength.

The receiver may comprise a plurality of amplifiers and the gain controller may be arranged to, during the first period of time, adjust the gain of only one of the plurality of amplifiers in dependence on each indication of signal strength.

The receiver may be arranged to operate in a synchronisation mode in which the receiver synchronises with the received signal and the gain controller may be arranged to, when the receiver is operating in the synchronisation mode, repeatedly determine the indications of signal strength and adjust the gain of the at least one amplifier in dependence on each of those indications of signal strength. The gain controller may be arranged to determine the subsequent indication of signal strength after the receiver has synchronised with the received signal.

The receiver may be arranged to generate a synchronisation detection signal responsive to it achieving synchronisation with the received signal, the gain controller being responsive to the synchronisation detection signal to stop repeatedly determining the indications of signal strength and adjusting the gain of the at least one amplifier in dependence on each of those indications of signal strength.

The gain controller may be arranged to continue repeatedly determining the indications of signal strength and adjusting the gain of the at least one amplifier in dependence on each of those indications of signal strength for a predetermined length of time after it receives the synchronisation detection signal.

The gain controller may be arranged to resume repeatedly determining the indication of signal strength and adjusting the gain of the at least one amplifier in dependence on each of those indications of signal strength a predetermined length of time after receiving the synchronisation detection signal.

The gain controller may be arranged to resume repeatedly determining the indication of combined signal strength and adjusting the gain of the at least one amplifier in dependence on each indication of signal strength if it does not receive a confirmation signal within a predetermined length of time of receiving the synchronisation detection signal.

The gain controller may be arranged to wait a predetermined length of time after it stops repeatedly determining the indication of combined signal strength and adjusting the gain of the at least one amplifier in dependence on each of those indications of signal strength before it determines the subsequent indication of signal strength.

The gain controller may be arranged to compare the subsequent indication of signal strength with a predetermined target strength and to make the single adjustment to the gain of the at least one amplifier in dependence on that comparison.

The predetermined target strength may comprise a relatively high value and a relatively low value, the gain controller being arranged to compare the subsequent indication of signal strength with the relatively high value and the relatively low value and to make the single adjustment to the gain of the at least one amplifier in dependence on the comparison.

The gain controller may be arranged to, if the indication of the signal strength of the selected signal is greater than the relatively low value and does not exceed the relatively high value, not adjust the gain of the at least one amplifier.

The gain controller may be arranged to compare the subsequent indication of signal strength with the predetermined target strength and with a predetermined strength range and to make the single adjustment to the gain of the at least one amplifier in dependence on the comparisons. The gain controller may be arranged to generate a reference number in dependence on the comparison(s).

The gain controller may store a look-up table that contains gain adjustments corresponding to each of a plurality of reference numbers, the gain controller being arranged to obtain the gain adjustment corresponding to the generated reference number from the look-up table and to adjust the gain of the at least one amplifier in dependence on that gain adjustment.

The receiver may comprise a plurality of amplifiers and the gain adjustments corresponding to each reference number contained in the look-up table may include gain adjustments associated with each of the plurality of amplifiers, the gain controller being arranged to obtain the gain adjustments corresponding to the generated reference number from the look-up table and to adjust the gain of an amplifier in dependence on the gain adjustment associated with that respective amplifier in the obtained gain adjustments.

The gain controller may be arranged to compare the subsequent indication of signal strength with a predetermined threshold and to, if the indication of signal strength exceeds the predetermined threshold, multiply subsequent indication of signal strength by an adjustment value and perform the comparison(s) using the result of the multiplication.

The gain controller may be arranged to, during the first period of time, adjust the gain of the at least one amplifier in dependence on an indication of signal strength by at least 6 dB.

The gain controller may be arranged to adjust the gain of the at least one amplifier in dependence on the subsequent signal strength by less than 6 dB. The gain controller may be arranged to adjust the gain of the at least one amplifier in dependence on the subsequent signal strength by one of 3 dB, 6 dB, 9 dB or 12 dB.

The gain controller may be arranged to determine the subsequent indication of signal strength during a preamble of the received signal.

The gain controller may be arranged to determine an indication of the strength of the received signal by measuring the Received Signal Strength Indication of the signal.

The gain controller may be arranged to, during the first period of time, determine an indication of signal strength from an analogue signal. The gain controller may be arranged to determine an indication of subsequent signal strength from a digital signal.

The at least one amplifier is preferably arranged to amplify the received signal.

The gain controller is preferably arranged to determine an indication of received signal strength from a signal output by at least one of the amplifier(s).

The gain controller may be arranged to determine the subsequent indication of signal strength and make the single adjustment to the gain of the at least one amplifier following uninterrupted receipt of the received signal for the first period of time by the receiver.

The gain controller may be arranged to, if receipt of the received signal by the receiver is interrupted before the gain controller makes the single adjustment to the gain of the at least one amplifier, not make the single adjustment to the gain of the at least one amplifier but wait until the receiver is receiving a subsequent signal, the gain controller being arranged to, when the receiver is receiving the subsequent signal, repeatedly determine the indications of signal strength for the first period of time using the subsequently received signal.

The gain controller may be arranged to, following the expiry of the first period of time, make no adjustments to the gain of the at least one amplifier other than the single adjustment until the gain controller repeats the steps of, for a first period of time, repeatedly determining an indication of signal strength and adjusting the gain of the at least one amplifier in dependence on each indication of signal strength.

According to a second embodiment of the invention, there is provided a receiver comprising a gain controller as claimed in any of claims 1 to 30.

According to a third embodiment of the invention, there is provided a method for controlling at least one amplifier in a receiver, the method comprising, when the receiver is receiving a signal: for a first period of time, repeatedly determining an indication of the strength of the received signal and adjusting the gain of the at least one amplifier in dependence on each indication of signal strength and, following the expiry of the first period of time: determining a subsequent indication of the strength of the received signal and making a single adjustment of the gain of the at least one amplifier in dependence on the subsequent indication of signal strength.

BRIEF DESCRIPTION OF THE DRAWINGS

For a better understanding of the present invention, reference is made to the following drawings in which.

DETAILED DESCRIPTION OF THE INVENTION

A gain controller according to certain embodiments of the invention is arranged to perform a two stage gain adjustment process. In the first stage, the gain controller repeatedly determines the strength of a signal being received by the receiver and adjusts the gain of at least one amplifier contained in the receiver in dependence on the received signal strength. The first stage is a free-running control process in which the gain controller continuously measures signal strength and adjusts the gain of the amplifier accordingly. In the second stage, the receiver makes a further adjustment to the gain of the at least one amplifier in a single "nudge". After the single "nudge" the gain controller makes no further adjustment to the receiver gain but leaves it unchanged until the receiver re-synchronises.

The gain controller may be arranged to adjust the gain of the receiver's amplifier(s) by a different amount when making the single adjustment than when making each adjustment during the continuous adjustment phase. For example, the gain controller may be arranged to make a smaller adjustment to the gain of the receiver's amplifier(s) for the single nudge than for each gain adjustment during the continuous adjustment phase. In such an implementation, the continuous adjustment phase can be considered a coarse tuning process and the single nudge can be considered a fine tuning process.

Some receivers, e.g. modems, have a two-stage receiving procedure in which the receiver initially performs a synchronisation process to "lock-on" to a desired signal and subsequently performs a data reception process in which the desired signal is decoded. A synchronisation process is typically used when the receiver is operating in an asynchronous communication system, i.e. the receiver does not know when it will receive the signal. The receiver synchronises with a signal by determining when it should sample the incoming signal to detect the transmitted data.

A gain controller according to certain embodiments of the invention may suitably be implemented in a receiver that initially performs a synchronisation process in order to lock onto a desired signal. The gain controller may perform the continuous gain adjustment phase during the synchronisation process and subsequently perform the single nudge after the receiver has synchronised with the wanted signal.

A gain controller according to certain embodiments of the invention is advantageous because it reduces the length of time for which the amplifier gains are continuously adjusted, which reduces the errors that occur due to "hunting" by the free running process. The gain controller according to certain embodiments of the invention is also advantageous because it addresses the problem of having a loud interferer running down the gain in the continuous adjustment phase. This problem is addressed by performing a single gain adjustment after the gain controller has finished the continuous adjustment phase. The single gain adjustment allows the gain controller to check whether the gain may have been set too low during the continuous adjustment phase by determining the signal strength of the received signal some time after the continuous adjustment phase. Preferably the time between the end of the continuous adjustment phase and the single nudge is sufficient for any interferer present during the continuous adjustment phase to have ceased transmitting.

The gain controller according to certain embodiments of the invention may suitably be implemented in a receiver that includes multiple amplifiers in the receive chain. The position of each amplifier in the receive chain can affect the degree to which changing the gain of that amplifier influences the amplitude of the signal as it is passed through the receive chain. The gain controller may therefore be advantageously arranged to preferentially adjust the gain of some of the amplifiers. The preferred amplifiers for adjustment may be selected in dependence on the measured signal strength of the received signal and/or whether the gain of the receive chain needs to be increased or decreased. The gain controller may also be advantageously arranged to adjust the gain of the amplifiers by different amounts. The gain controller may decide how much to adjust the gain of each amplifier in dependence on, for example, stored parameters associated with that amplifier, the position of the amplifier in the receive chain, the overall adjustment to be made to the gain of the receive chain and whether the gain controller is performing a continuous adjustment process or the single nudge.

A gain controller according to one embodiment of the invention will now be described with reference to a specific implementation. This is for the purposes of example only and it should be understood that the gain controller of the invention is not limited to this or any other implementation.

Figure 1:
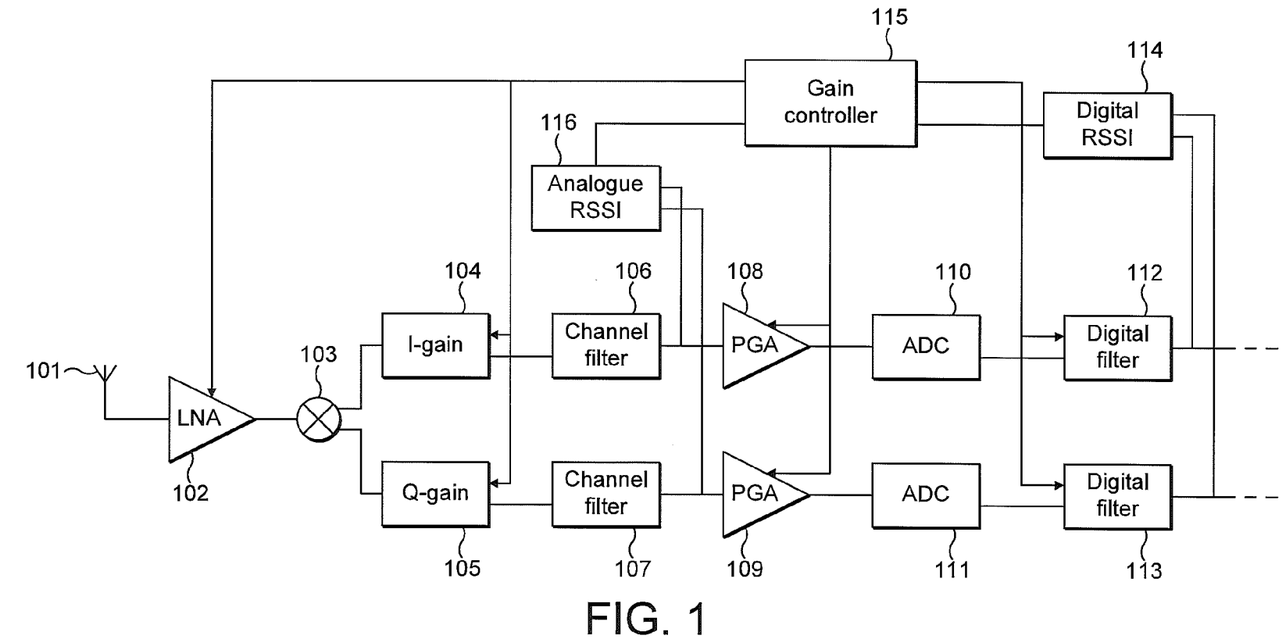
FIG. 1 shows a receiver including a gain controller according to an embodiment of the invention.

FIG. 1 shows a receiver having an analogue section and a digital section that is suitable for use with a gain controller according to embodiments of the invention. The receiver comprises an antenna 101, a low noise amplifier 102 and a mixer 103 that splits the received signal into in-phase and quadrature components. Each of the I- and Q-sections may have its own gain associated with it 104, 105. The receiver also comprises two channel filters 106, 107, programmable-gain amplifiers 108,109 and analogue-to-digital converters 110, 111. Following the analogue-to-digital converters are two digital filters 112,113. A power estimator 116 determines the analogue RSSI (Received Signal Strength Indicator) after the channel filters. A further power estimator 114 determines the digital RSSI after the digital filters. The gain controller 115 receives the analogue and digital RSSI from the power estimators and is arranged to control the gain of each of the amplifiers in the receive chain.

Figure 5:
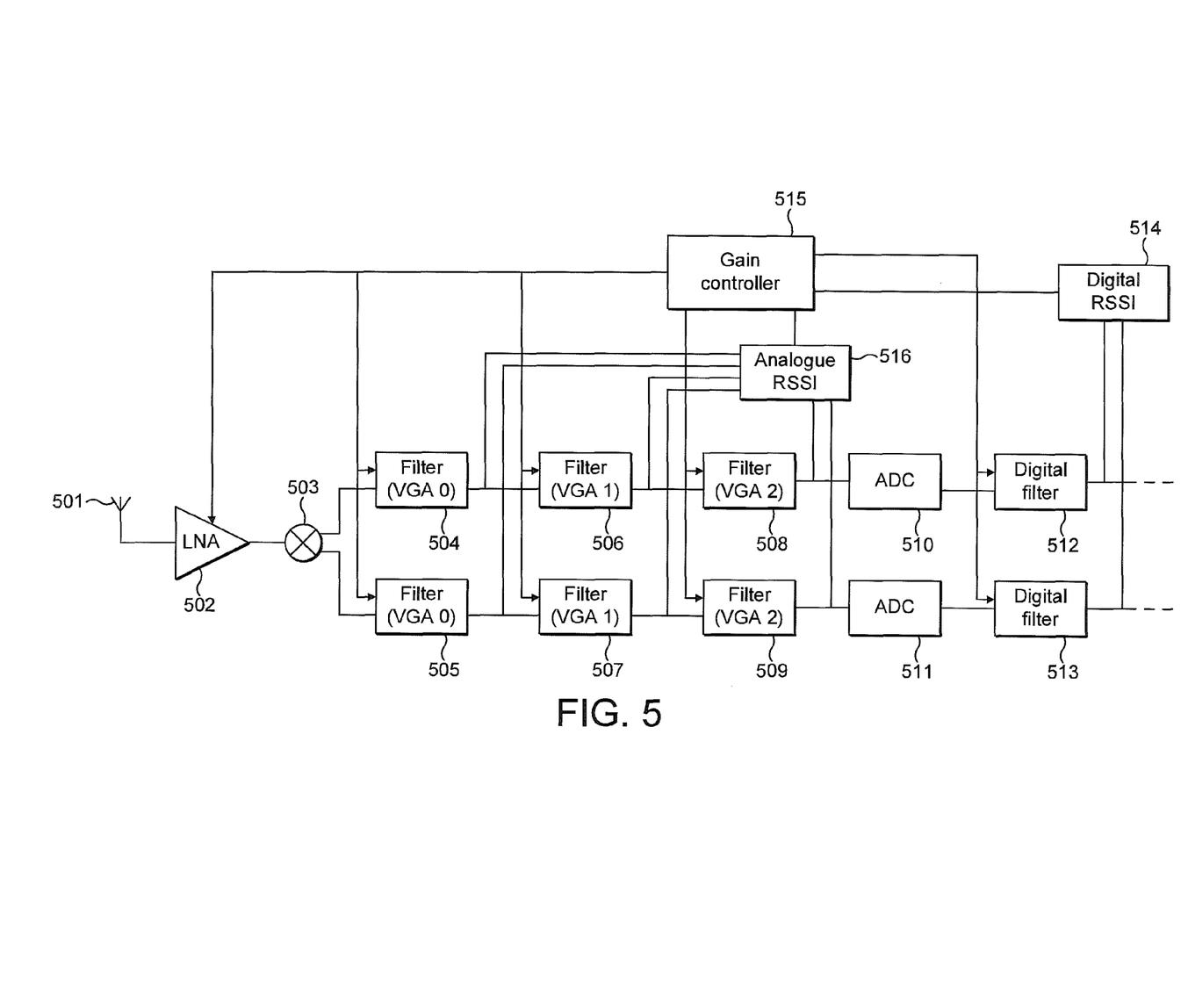
FIG. 5 shows a specific implementation of a receive chain in which a gain controller according to embodiments of the invention may suitably be implemented.

It should be understood that FIG. 1 illustrates a typical receive chain for the purposes of example only, and that the gain controller according to embodiments of the invention is not limited to being used in a receive chain of any specific implementation. For example, the arrangement of a gain section (104, 105), filter section (106, 107) and programmable amplifier (108, 109) in each of the I- and Q-paths shown in FIG. 1 might suitably be replaced with three filters in series, each with an integral gain associated with it (e.g. VGA0, VGA1, VGA2). A receive chain having this specific implementation is shown in FIG. 5. In such a receive chain, the analogue RSSI (516) can be measured at the output of each of the filters (504 to 509) and fed to the gain controller. The filters can be considered as a combination of a filter component plus a gain component, in which case the output of the gain component should be measured and provided to the gain controller. More generally, the receive chain preferably includes multiple variable gain amplifiers and multiple analogue RSSI measurement points, one after each variable gain amplifier, so that the status of each variable gain amplifier can be determined by the gain controller.

Suitably the gain controller controls the gain of each respective amplifier in the I- and Q-paths of the receive chain to be the same.

The gain controller is arranged to control receiver gain based on two separate sets of RSSI measurements: analogue measurements taken within the radio and digital measurements within the RCD (receiver-carrier detector) block.

Figure 2:
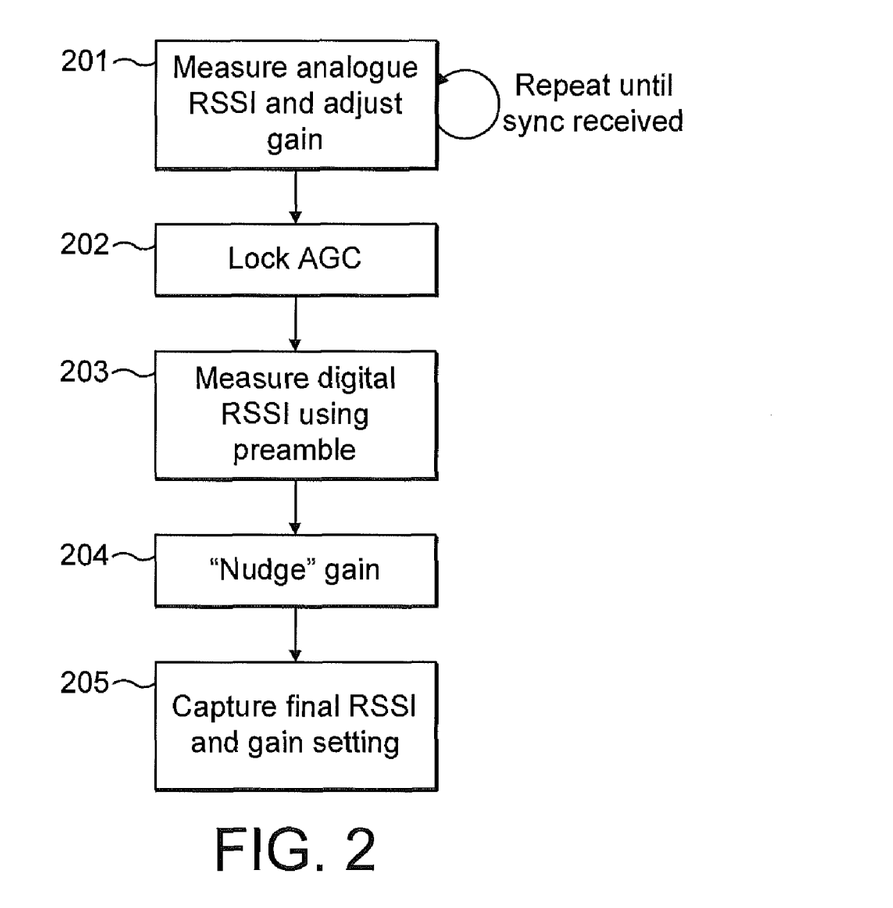
FIG. 2 shows the steps of a method according to an embodiment of the invention.

Gain control consists of a number of phases as illustrated in FIG. 2:

Step 201: Measure the analogue RSSI of the received signal and adjust the receiver gain in dependence on the analogue RSSI until a sync is seen by the internal sync detector.

Step 202: Lock the automatic gain control (AGC) after a sync is seen by the internal sync detector. Optionally, the gain controller may wait until the analogue RSSI is not overloaded before locking the AGC (i.e. ending the process of continuous gain control). This may be achieved by locking the gain control only after a programmable delay from the sync being seen by the internal sync detector.

Step 203: After a further programmable delay, measure the digital RSSI for the period of the preamble of the received signal. In one implementation, the received signal is sampled at 20 MHz and 16 samples are used to measure the digital RSSI if the received signal is an OFDM (Orthogonal Frequency Division Multiplexing) signal and 20 samples are used to measure the digital RSSI if the received signal is a CCK (Complementary Code Keying) signal.

Step 204: "Nudge" the gain by up to 12 dB in either direction based on 4 limit values stored in registers. Separate values may be used depending on whether the receiver is receiving OFDM or CCK signals.

Step 205: After another programmable delay, capture the final RSSI and gain settings and make them available to software.

Figure 4:
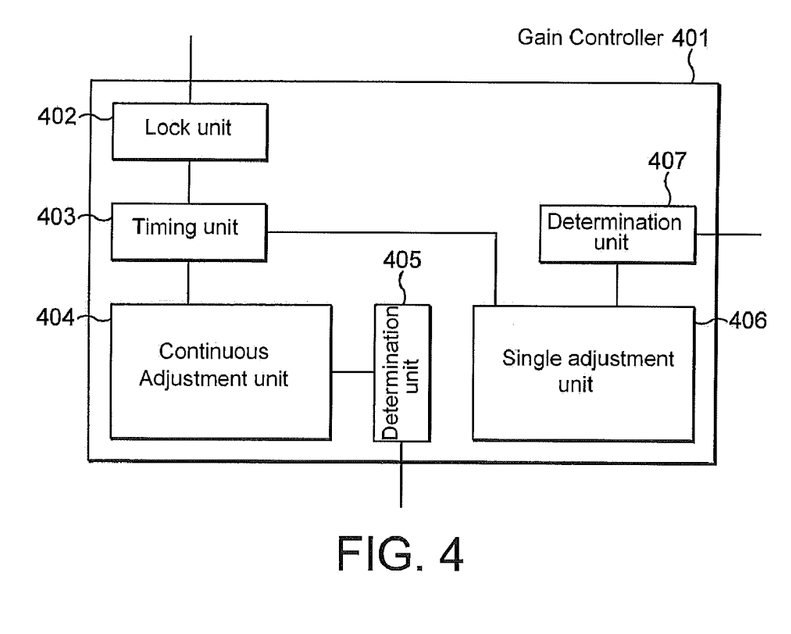
FIG. 4 shows a gain controller according to certain embodiments of the invention.

FIG. 4 illustrates the functional units that may be contained in a gain controller according to certain embodiments of the invention. This is for the purposes of example only and it should be understood that the network devices according to embodiments of the invention are not limited to any specific implementation. In particular, in FIG. 4 separate functional units for performing each different function are shown. However, the various operations performed by each device could be divided differently between functional units. The functional units need not be implemented in separate blocks, as shown in FIG. 4.

The gain controller 401 comprises a lock unit 402, which is arranged to receive lock signals from one or more synchronisation units in the receiver and a timing unit 403, which is arranged to receive information from the lock unit about the synchronisation of the receiver and to control the continuous adjustment unit 404 and single adjustment unit 406 in dependence on the information it receives from the lock unit and predetermined timing information that is has access to (e.g. timing information that is stored in registers). The continuous adjustment unit is arranged to receive information indicating the strength of the received signal from a first determination unit 405. The single adjustment unit is arranged to receive information indicating the strength of the received signal from a second determination unit 407.

The gain controller may be implemented in hardware or software. Preferably the gain controller is implemented in hardware, as the gain controller is required to have a faster reaction time than is typically achievable in software alone. However, software may advantageously be used to control some of the parameters used by the gain controller, for example, values stored in registers that are used by the gain controller. Alternatively, the values used by the gain controller could be hard-wired into the system, or stored in another form of re-writable memory such as RAM or flash memory.

If for some reason the gain controller is disabled, the receiver gain can be set to predetermined values that are stored in the receiver. For example, the analogue gains can be set to a value specified in one register and the low pass filter gain can be set to a value specified in another register.

Figure 3:
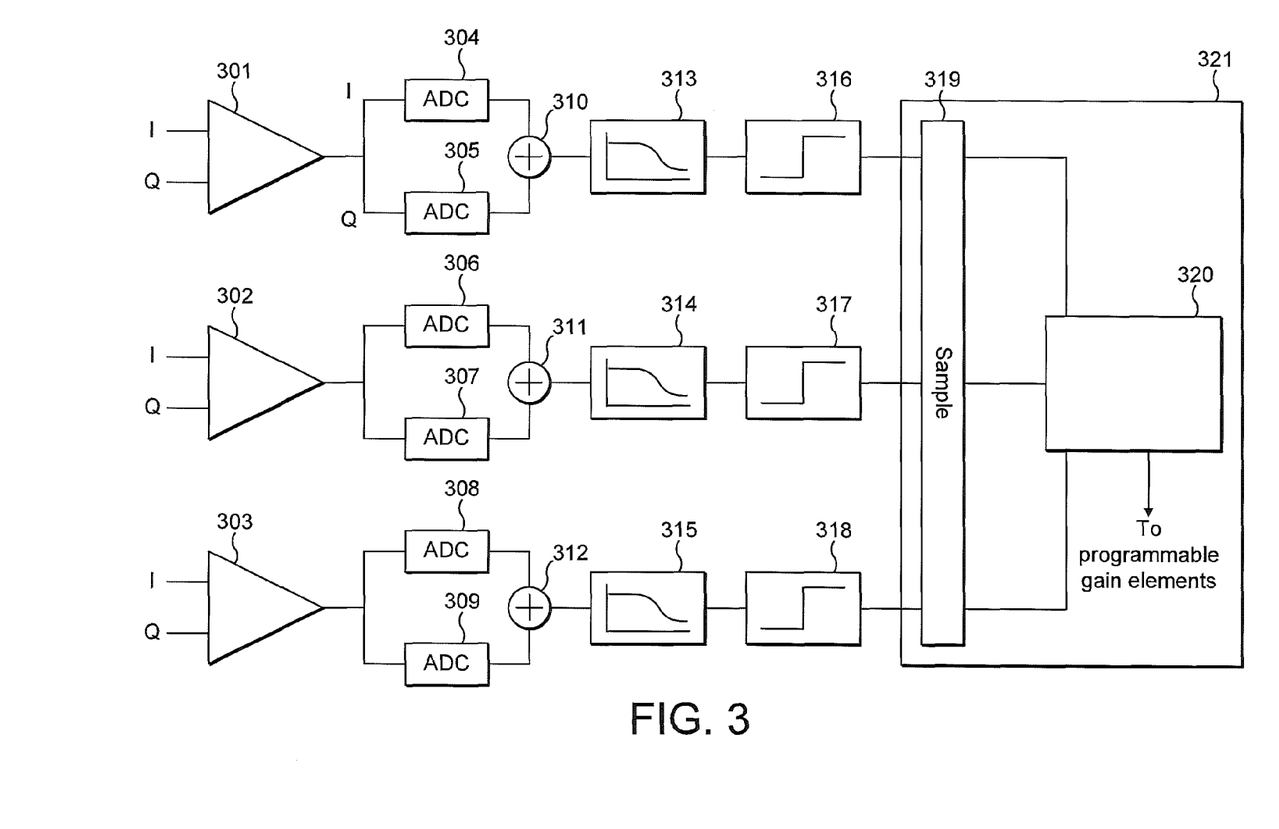
FIG. 3 shows a gain controller and amplifiers according to a certain embodiment of the invention.

The coarse gain control performed by the gain controller during the free-running phase will now be described in more detail with reference to FIG. 3. FIG. 3 shows a further specific implementation in which the in-phase and quadrature signals are passed through three variable gain amplifiers, VGA0, VGA1 and VGA2.

The analogue RSSI provides the primary control mechanism during the free running phase. It has 2½ bit analogue-to-digital converters (304 to 309) on the I and Q outputs of VGA0 VGA1 and VGA2 (301 to 303). The I and Q outputs are digitised by the analogue to digital converters, combined into a single vector by summation units 310 to 312 and the magnitude of the single vectors is low pass filtered by filters 313 to 315. The resulting signals are compared against two programmable thresholds (316 to 318) to generate an "output too high/too low" indication at each stage. The outputs from these comparators are fed to the Receiver Gain Control block (321) (which functions as the gain controller in this implementation), which samples (319) them at a rate programmable as a division of the AGC clock. The Receiver Gain Control block adjusts the receiver gain (320) until none of the comparators are outputting an "output too high/too low" indication. The Receiver Gain Control block adjusts the gains of the various amplifiers in the receive chain in dependence on these "output too high/too low" indications (e.g. in dependence on which of the comparators is outputting an "output too high/too low" indication) and in dependence on programmable parameters that define the maximum and minimum gains allowed for each programmable gain element in the receive chain. Only one gain stage is adjusted on each clock. The gain stages are arranged in a priority order and are adjusted in turn. The Receiver Gain Control block adjusts the gain stage highest in the current priority order that is causing an "output too high/too low" indication to be outputted by a comparator in the Receiver Gain Control block. A programmable number of wait states (from 0 to 3) can be inserted after each gain change to allow for settling time.

The gain controller may be arranged to adjust the programmable gain elements in the receive chain according to a predetermined priority order. The gain controller may use a different priority order depending on whether the overall gain of the receive chain has to be increased or decreased. For example, when decreasing the overall gain of the receive chain, the gain controller may first decrease the gain of the programmable gain element closest to the antenna. When increasing the overall gain of the receive chain, the gain controller may first increase the gain of the programmable amplifier furthest from the antenna.

Each adjustment of receiver gain is typically 6 dB.

Once a sync has been achieved by the modem, the Receiver Gain Control block receives an AGC_LOCK indication. The Receiver Gain Control block locks the AGC responsive to receiving that signal, such that no further gain adjustments (excepting the single "nudge") can take place. The exact timing of locking the AGC is under register control. There is a programmable delay from the sync to locking the gain control. Typically, the programmable delay is a three bit number set in a register. The three bit number may be in units of 800 ns.

The receiver may have two or more modems in some implementations. For example, the receiver may have one modem for receiving OFDM signals and one modem for receiving CCK signals. The Receiver Gain Control block may lock the AGC when it receives an AGC_LOCK indication from any of the two or more modems.

Locking the AGC may also be delayed until the RSSI has stabilised. This is to avoid problems from early false sync pulses. For these purposes, the RSSI is defined as stable if there are no analogue RSSI bits set indicating that a receiver stage is overloaded while it is still possible to lower the gain of at least one amplifier in the receive chain. This means that a weak signal indication will not prevent the AGC from locking. The RSSI effect on AGC locking is disabled if the appropriate bit in a configuration register is not set.

The gain controller may be implemented in a receiver that includes two synchronisers that attempt to synchronise the receiver with the wanted signal. The relevant telecommunications standards specify that the receiver has to achieve synchronisation very quickly, and therefore one of the synchronisers performs a rapid synchronisation to meet the requirements of the standard. The first synchroniser can make mistakes due to this need for rapid synchronisation. The second synchroniser is slower than the first synchroniser but more accurate. The gain controller according to certain embodiments of the invention can be arranged to have a defence mechanism against false internal syncs. In this implementation, the gain controller is arranged to lock the AGC if it receives an AGC_LOCK indication from the first, rapid synchroniser. However, if no external modem sync is received from the second synchroniser within a predetermined time from the signal received from the first synchroniser, the gain controller assumes that the first synchroniser made a mistake and releases the AGC lock. The predetermined time may suitably be within 8 us for OFDM or a programmable delay set in registers for CCK. This improves the chances for the radio to receive a burst correctly should a false positive be generated by the internal sync generator.

There is also a timeout which starts running from when the AGC locks that is used to release the AGC should a false sync cause it to lock. Without this mechanism the AGC would remain locked until the software decided to take the radio out of receive mode. The timeout value may be stored in a register. The units may suitably be 1024×50 ns (roughly 50 us) up to a maximum timeout around 50 ms. This allows for the longest packet which is around 33 ms (4096 octets at 1 Mb/s).

The fine tuning gain control performed by the gain controller after the free-running phase will now be described in more detail.

The single "nudge" provides the possibility of another change to the gain settings after the AGC has locked. This is intended to fine tune the gain to achieve better than +/−6 dB accuracy, which is all that is possible based on the basic mechanism described above. The nudge consists of a single adjustment of −12 dB, −9 dB, −6 dB, −3 dB, 0, +3 dB, +6 dB, +9 dB or +12 dB applied to the system. The fine gain control mechanism is activated by a programmed delay from the initial AGC lock, and is applied based on the digital RSSI measurement at that time. The programmed delay is stored as a three bit field in units of 200 ns in a register. When the delay expires, the signal is sampled for one period of the preamble (16 samples for OFDM or 20 samples for CCK), which are summed to produce a precise estimate of the RSSI.

The period of the wanted signal is used to measure the RSSI for the nudge so that the result is not biased by the start time of the measurement relative to the peaks in the preamble. In addition there is a fiddle factor applied to compensate for clipping when the signal is very loud. When the measured RSSI is greater than a certain threshold, it is multiplied by 9/8. This is a fairly inaccurate adjustment but it does have a beneficial effect of allowing a −12 dB nudge for very loud signals, which would not otherwise be possible with typical Target/3 DB register settings.

The adjustment is performed by comparing the digital RSSI with two registers. Each register stores an 8 bit "high" and "low" field. If the digital RSSI is within the original target range, no analogue adjustment is made. If the digital RSSI falls between the TARGET and 3 DB_RANGE values, a 3 dB adjustment in the appropriate direction is made. Between the 3 DB_RANGE values and twice or half the TARGET values, a 6 dB adjustment in the appropriate direction is made. Between twice or half the TARGET and 3 DB_RANGE values, a 9 dB adjustment, and outside twice or half the 3 DB_RANGE values, a 12 dB adjustment is made. These adjustments are shown in the following table.

TABLE 1

| If RSSI is: | Nudge is: |
|---|---|
| RSSI > 2 * 3 dB_hi_limit | −12 dB |
| 2 * 3 dB_hi_limit ≧ RSSI > 2 * target_hi_limit | −9 dB |
| 2 * target_hi_limit ≧ RSSI > 3 dB_hi_limit | −6 dB |
| 3 dB_hi_limit ≧ RSSI > target_hi_limit | −3 dB |
| target_hi_limit ≧ RSSI > target_lo_limit | 0 |
| target_lo_limit ≧ RSSI > 3 dB_lo_limit | +3 dB |
| 3 dB_lo_limit ≧ RSSI > 0.5 * target_lo_limit | +6 dB |
| 0.5 * target_lo_limit ≧ RSSI > 0.5 * 3 dB_lo_limit | +9 dB |
| RSSI ≦ 0.5 * 3 dB_lo_limit | +12 dB |

The overall adjustment or nudge can be divided into a individual adjustments to be made to the gain of each of the adjustable amplifiers in the receiver. Suitably, the overall adjustment may be calculated in terms of number of 6 dB adjustments and 3 dB adjustments. For example, 6 dB adjustments may be suitably applied to VGA2. VGA1 may also be adjusted by 6 dB if necessary. Any remaining 6 dB adjustments may be converted into 3 dB adjustments and applied to VGA0. Any remaining 3 dB adjustments may then be applied to the low noise amplifier. Any remaining adjustments may be applied to "VGA3". VGA3 may not be an amplifier but actually an attenuator applied at some point in the receive chain. Finally, if there is gain change required that is not achievable using the analogue gain controls, that gain change may be applied to the gain controls on the digital low pass filter block. This means that the analogue gains are chosen to optimise the signal size at the ADC inputs, theoretically achieving an accuracy of +/−1.5 dB. The system's dynamic range is maximised by controlling all possible receiver gain settings.

Control of the low noise amplifier and first VGA gains is typically combined, given that there is no information to separate them out. Accordingly, digital logic within the gain controller may generate a single number to use as an index into a lookup table, which distributes the required gain between the two stages. The entries of this lookup table may be mapped into address space.

The number of settings for each VGA is under the control of registers, which store a minimum and maximum gain number for each stage. These should be set to match the analogue design. There is a further use for these settings in that they can be used to limit the range of gains available or to stop the gain controller from being able to change the gain of some stages, either for debugging, problem workaround or enhanced AGC algorithms. Minimum gain is achieved with a setting of 0, and maximum gain varies from amplifier to amplifier.

Each of the comparator outputs that make up the analogue RSSI can be masked off in the RCD, should it prove necessary. Masking is controlled by values in the registers.

When an appropriate bit is set in a register, the corresponding comparator output is ignored. The actual levels used by the comparators are also programmable using fields stored in registers.

Wait states (i.e. the time periods for which the gain controller ignores all RSSI measurements) are set using a register. The may have a field for each of the 4 stages to program a number of wait states from 0 to 3 which are used after a gain stage has been changed.

The digital RSSI estimates the magnitude of the signal using an approximation of 12 chords to a circle which is then averaged. The averaging of these is programmable, in that the IIR filter coefficient can be set in registers.

The period of the AGC clock may suitably be the 20 MHz clock divided by a number, which may be stored in a register.

The look up table may be loaded by the firmware based on calibrations performed at the time.

An alternative scheme for reducing the "hunting" by the free running process is to assess an interferer dynamically during the free running phase. Simulations have shown that this method is prone to ending up with a significantly poorer result than the "nudge" method described above, particularly with an analogue radio.

The method described above advantageously uses the analogue RSSI during the free running process and the digital RSSI for the "nudge". The analogue RSSI is the more accurate estimate of signal strength during the synchronisation process, before the amplifiers have been adjusted to provide the analogue-to-digital converters with the correct signal amplitude. However, once the receiver has synchronised with the wanted signal the signal input into the analogue-to-digital converters should be of approximately the correct amplitude. The digital RSSI will therefore tend to be the more accurate of the two estimates for fine tuning the receiver gain, particularly since the digital RSSI is estimated after the channel filters, which remove more interference than the analogue filters alone.

A gain controller according to embodiments of the invention may suitably be implemented in a modem used in a wireless communication system, such as a wireless local area network. Although the specific gain controller described above has been described as receiving OFDM or CCK signals, this is for the purposes of example only and a gain controller according to embodiments of the invention may be implemented in a receiver capable of demodulating any type of signal.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A gain controller for controlling the gain of at least one amplifier in a receiver, the gain controller being arranged to, when the receiver is receiving a signal:

during a first period of time of receiving said signal:
repeatedly determine an indication of the strength of the received signal and adjust the gain of the at least one amplifier in dependence on each indication of signal strength; and
receive a synchronisation detection signal, the synchronisation signal being generated by the receiver responsive to the receiver achieving synchronisation with the received signal, wherein the gain controller is responsive to the synchronisation detection signal to stop repeatedly determining the indications of signal strength and adjusting the gain of the at least one amplifier in dependence on each of those indications of signal strength; and following the expiry of the first period of time of receiving said signal and receipt by the gain controller of the synchronisation detection signal:
determine a subsequent indication of the strength of said received signal and make a single adjustment of the gain of the at least one amplifier in dependence on the subsequent indication of signal strength.

2. A gain controller as claimed in claim 1, wherein the gain controller is arranged to, during the first period of time, wait a predetermined length of time after each adjustment of the at least one amplifier before determining a further indication of signal strength.

3. A gain controller as claimed in claim 1, wherein the receiver comprises a plurality of amplifiers and the gain controller is arranged to, during the first period of time, adjust the gain of only one of the plurality of amplifiers in dependence on each indication of signal strength.

4. A gain controller as claimed in claim 1, wherein the receiver is arranged to operate in a synchronisation mode in which the receiver synchronises with the received signal and the gain controller is arranged to, when the receiver is operating in the synchronisation mode, repeatedly determine the indications of signal strength and adjust the gain of the at least one amplifier in dependence on each of those indications of signal strength.

5. A gain controller as claimed in claim 1, wherein the gain controller is arranged to determine the subsequent indication of signal strength after the receiver has synchronised with the received signal.

6. A gain controller as claimed in claim 1, wherein the gain controller is arranged to continue repeatedly determining the indications of signal strength and adjusting the gain of the at least one amplifier in dependence on each of those indications of signal strength for a predetermined length of time after it receives the synchronisation detection signal.

7. A gain controller as claimed in claim 1, wherein the gain controller is arranged to resume repeatedly determining the indication of signal strength and adjusting the gain of the at least one amplifier in dependence on each of those indications of signal strength a predetermined length of time after receiving the synchronisation detection signal.

8. A gain controller as claimed in claim 1, wherein the gain controller is arranged to resume repeatedly determining the indication of combined signal strength and adjusting the gain of the at least one amplifier in dependence on each indication of signal strength if it does not receive a confirmation signal within a predetermined length of time of receiving the synchronisation detection signal.

9. A gain controller as claimed in claim 1, wherein the gain controller is arranged to wait a predetermined length of time after it stops repeatedly determining the indication of combined signal strength and adjusting the gain of the at least one amplifier in dependence on each of those indications of signal strength before it determines the subsequent indication of signal strength.

10. A gain controller as claimed in claim 1, wherein the gain controller is arranged to compare the subsequent indication of signal strength with a predetermined target strength and to make the single adjustment to the gain of the at least one amplifier in dependence on that comparison.

11. A gain controller as claimed in claim 10, wherein the predetermined target strength comprises a relatively high value and a relatively low value, the gain controller being arranged to compare the subsequent indication of signal strength with the relatively high value and the relatively low value and to make the single adjustment to the gain of the at least one amplifier in dependence on the comparison.

12. A gain controller as claimed in claim 11, wherein the gain controller is arranged to, if the indication of the signal strength of the selected signal is greater than the relatively low value and does not exceed the relatively high value, not adjust the gain of the at least one amplifier.

13. A gain controller as claimed in claim 10, wherein the gain controller is arranged to compare the subsequent indication of signal strength with the predetermined target strength and with a predetermined strength range and to make the single adjustment to the gain of the at least one amplifier in dependence on the comparisons.

14. A gain controller as claimed in claim 10, wherein the gain controller is arranged to generate a reference number in dependence on the comparison(s).

15. A gain controller as claimed in claim 14, wherein the gain controller stores a look-up table that contains gain adjustments corresponding to each of a plurality of reference numbers, the gain controller being arranged to obtain the gain adjustment corresponding to the generated reference number from the look-up table and to adjust the gain of the at least one amplifier in dependence on that gain adjustment.

16. A gain controller as claimed in claim 15, wherein the receiver comprises a plurality of amplifiers and the gain adjustments corresponding to each reference number contained in the look-up table include gain adjustments associated with each of the plurality of amplifiers, the gain controller being arranged to obtain the gain adjustments corresponding to the generated reference number from the look-up table and to adjust the gain of an amplifier in dependence on the gain adjustment associated with that respective amplifier in the obtained gain adjustments.

17. A gain controller as claimed in claim 10, wherein the gain controller is arranged to compare the subsequent indication of signal strength with a predetermined threshold and to, if the indication of signal strength exceeds the predetermined threshold, multiply subsequent indication of signal strength by an adjustment value and perform the comparison(s) using the result of the multiplication.

18. A gain controller as claimed in claim 1, wherein the gain controller is arranged to, during the first period of time, adjust the gain of the at least one amplifier in dependence on an indication of signal strength by at least 6 dB.

19. A gain controller as claimed in claim 1, wherein the gain controller is arranged to adjust the gain of the at least one amplifier in dependence on the subsequent signal strength by less than 6 dB.

20. A gain controller as claimed in claim 1, wherein the gain controller is arranged to adjust the gain of the at least one amplifier in dependence on the subsequent signal strength by one of 3 dB, 6 dB, 9 dB or 12 dB.

21. A gain controller as claimed in claim 1, wherein the gain controller is arranged to determine the subsequent indication of signal strength during a preamble of the received signal.

22. A gain controller as claimed in claim 1, wherein the gain controller is arranged to determine an indication of the strength of the received signal by measuring the Received Signal Strength Indication of the signal.

23. A gain controller as claimed in claim 1, wherein the gain controller is arranged to, during the first period of time, determine an indication of signal strength from an analogue signal.

24. A gain controller as claimed in claim 1, wherein the gain controller is arranged to determine an indication of subsequent signal strength from a digital signal.

25. A gain controller as claimed in claim 1, wherein the at least one amplifier is arranged to amplify the received signal.

26. A gain controller as claimed in claim 25, wherein the gain controller is arranged to determine an indication of received signal strength from a signal output by at least one of the amplifier(s).

27. A gain controller as claimed in claim 1, wherein the gain controller is arranged to determine the subsequent indication of signal strength and make the single adjustment to the gain of the at least one amplifier following uninterrupted receipt of the received signal for the first period of time by the receiver.

28. A gain controller as claimed in claim 27, wherein the gain controller is arranged to, if receipt of the received signal by the receiver is interrupted before the gain controller makes the single adjustment to the gain of the at least one amplifier, not make the single adjustment to the gain of the at least one amplifier but wait until the receiver is receiving a subsequent signal, the gain controller being arranged to, when the receiver is receiving the subsequent signal, repeatedly determine the indications of signal strength for the first period of time using the subsequently received signal.

29. A gain controller as claimed in claim 1, wherein the gain controller is arranged to, following the expiry of the first period of time, make no adjustments to the gain of the at least one amplifier other than the single adjustment until the gain controller repeats the steps of, for a first period of time, repeatedly determining an indication of signal strength and adjusting the gain of the at least one amplifier in dependence on each indication of signal strength.

30. A receiver comprising a gain controller as claimed in claim 1.

31. A method for controlling at least one amplifier in a receiver, the method comprising, when the receiver is receiving a signal:
 for a first period of time of receiving said signal, repeatedly determining an indication of the strength of the received signal and adjusting the gain of the at least one amplifier in dependence on each indication of signal strength;
 during the first period of time, generate a synchronisation detection signal in response to the receiver achieving synchronisation with the received signal, the gain controller being responsive to the synchronisation detection signal to stop repeatedly determining the indications of signal strength and adjusting the gain of the at least one amplifier in dependence on each of those indications of signal strength; and
 following the expiry of the first period of time of receiving said signal:
 determining a subsequent indication of the strength of said received signal and making a single adjustment of the gain of the at least one amplifier in dependence on the subsequent indication of signal strength.

32. A gain controller for controlling the gain of at least one amplifier in a receiver, the gain controller being arranged to, when the receiver is receiving a signal:
 for a first period of time, repeatedly determine an indication of the strength of the received signal and adjust the gain of the at least one amplifier in dependence on each indication of signal strength; and
 following the expiry of the first period of time:
 determine a subsequent indication of the strength of the received signal and make a single adjustment of the gain of the at least one amplifier in dependence on the subsequent indication of signal strength following uninterrupted receipt of the received signal for the first period of time by the receiver, and;
 wherein the gain controller is arranged to, if receipt of the received signal by the receiver is interrupted before the gain controller makes the single adjustment to the gain of the at least one amplifier, not make the single adjustment to the gain of the at least one amplifier but wait until the receiver is receiving a subsequent signal, the gain controller being arranged to, when the receiver is receiving the subsequent signal, repeatedly determine the indications of signal strength for the first period of time using the subsequently received signal.

33. A gain controller for controlling the gain of at least one amplifier in a receiver, the gain controller being arranged to, when the receiver is receiving a signal:
 for a first period of time, repeatedly determine an indication of the strength of the received signal and adjust the gain of the at least one amplifier in dependence on each indication of signal strength; and
 following the expiry of the first period of time:
 determine a subsequent indication of the strength of the received signal and make a single adjustment of the gain of the at least one amplifier in dependence on the subsequent indication of signal strength;
 wherein the gain controller is arranged to, following the expiry of the first period of time, make no adjustments to the gain of the at least one amplifier other than the single adjustment until the gain controller repeats the steps of, for a first period of time, repeatedly determining an indication of signal strength and adjusting the gain of the at least one amplifier in dependence on each indication of signal strength.

\* \* \* \* \*